United States Patent
Abergel

(10) Patent No.: US 8,822,562 B2
(45) Date of Patent: Sep. 2, 2014

(54) INK-JET PRINTER INK

(75) Inventor: Edmond Abergel, Paris (FR)

(73) Assignee: M.G.I. USA, Inc., Melbourne, FL (US)

( * ) Notice: Subject to any disclaimer, the term of this patent is extended or adjusted under 35 U.S.C. 154(b) by 1174 days.

(21) Appl. No.: 12/649,734

(22) Filed: Dec. 30, 2009

(65) Prior Publication Data

US 2010/0166975 A1 Jul. 1, 2010

(30) Foreign Application Priority Data

Dec. 30, 2008 (FR) ...................................... 08 07502

(51) Int. Cl.
- C08F 20/22 (2006.01)
- C09D 11/10 (2014.01)
- C08J 3/28 (2006.01)
- C08F 2/50 (2006.01)

(52) U.S. Cl.
USPC .............. 522/182; 522/100; 522/103; 522/90; 522/96; 522/93; 522/113; 522/121; 522/134; 522/142; 522/141; 522/150; 522/152; 522/179; 522/181; 522/170; 522/173; 522/174; 522/178; 522/909; 522/74; 522/75; 522/81; 523/161; 106/31.13; 106/31.6

(58) Field of Classification Search
USPC ............... 522/100, 103, 90, 93, 96, 113, 121, 522/134, 142, 141, 150, 151, 152, 179, 181, 522/170, 173, 174, 178, 182, 909; 523/160, 523/161; 106/31.13, 31.6
See application file for complete search history.

(56) References Cited

U.S. PATENT DOCUMENTS

| | | | |
|---|---|---|---|
| 6,114,406 A * | 9/2000 | Caiger et al. .................. | 522/121 |
| 7,279,506 B2 | 10/2007 | Sisler et al. | |
| 7,451,698 B2 | 11/2008 | Schneider et al. | |
| 7,614,725 B2 | 11/2009 | Schulmeister | |
| 7,754,779 B2 * | 7/2010 | Odell et al. ..................... | 522/10 |
| 2005/0261391 A1 | 11/2005 | Narayan-Sarathy et al. | |
| 2008/0138531 A1 * | 6/2008 | Laginess et al. .............. | 427/508 |
| 2009/0099277 A1 * | 4/2009 | Nagvekar et al. ............. | 522/153 |

FOREIGN PATENT DOCUMENTS

| | | |
|---|---|---|
| EP | 1589080 | 10/2005 |
| EP | 1749670 | 2/2007 |
| WO | 9918134 | 4/1999 |
| WO | WO 2008139188 A1 * | 11/2008 |

OTHER PUBLICATIONS

Inca Spyder 320 pdroduct description from FujiFilm. (no date on document: document No. 320_100218). Retrieved online. Retrieved on Jun. 3, 2013. Retrieved from internet <URL:http://fuji.mighty-site.com/filebin/Sell%20Sheets%202010/incaspyder320_100218_lr.pdf>.*

* cited by examiner

Primary Examiner — Sanza McClendon
(74) Attorney, Agent, or Firm — Lowe Hauptman & Ham, LLP

(57) ABSTRACT

Ink deposited on a substrate by an ink-jet arrangement to form a protective layer includes hardenable oligomer, hardenable monomer selected from a group including alkoxylated and/or poly-alkoxylated acrylic monomers comprising one or more di- or tri-acrylates, and a photoinitiator. The oligomer has a room temperature viscosity greater than 1 Pa·s. The oligomer to monomer weight ratio is between 1/6 and 1/25. The ink has a room temperature viscosity between 15 and 22 mPa·s and between 5 and 2 mPa·s at 60° C., and a room temperature surface tension between 15 and 28 mN/m. The photoinitiator is activated by a UV source having an appropriate wavelength and intensity.

18 Claims, 2 Drawing Sheets

| Product name | Chemical name | % | % | % | Properties |
|---|---|---|---|---|---|
| Genorad 16 | / | 1 | 1 | 1 | Inhibits free radicals; prevents varnish agglomeration |
| IBOA | isobornyl acrylate | 20 | 20 | 15 | Varnish adhesion and decrease in viscosity |
| EBECRYL ODA | octyl-decyl acrylate | 15 | 15 | 15 | Decrease in surface tension and viscosity |
| EBECRYL 8402 | urethane acrylate | 8 | | | Increases varnish reactivity and toughness |
| EBECRYL 220 | urethane acrylate | | 4 | | Increases varnish reactivity, toughness and resistance to scratching |
| EBECRYL 605 | epoxy acrylate | | | 10 | Increases varnish reactivity, toughness and resistance to scratching |
| Tego Foamex 805 | / | 0.3 | 0.3 | 0.3 | Surfactant |
| OTA 480 | propoxylated glycerol tri-acrylate | 12 | 16 | 15 | Increases varnish reactivity and chemical resistance |
| TPGDA | tripopylene glycol di-acrylate | 20 | 20 | 20 | Increases varnish reactivity |
| N-vinylcaprolactam | / | 10 | 10 | 10 | Adhesion to plastic, principally PVC |
| Irgacur 907 | 2 methyl-1-4-methylthiophenyl-2-4-morpholinyl-propanone | 4.9 | 4.9 | 4.9 | Deep and surface photoinitiator |
| Additol ITX | 2-iso propyl thioxanthone | 7.2 | 7.2 | 7.2 | Surface photoinitiator |
| Tego Wett 500 | / | 1.0 | 1.0 | 1.0 | Surfactant for satisfactory spreading of the varnish on all support types |
| | | 100 | 100 | 100 | |

Figure 1

INK-JET PRINTER INK

RELATED APPLICATION

The present application is based on, and claims priority from, FR Application Number 08/07502, filed Dec. 30, 2008, the disclosure of which is hereby incorporated by reference herein in its entirety.

FIELD OF INVENTION

The present invention relates to ink-jet printers applying protective layers to substrates. More particularly, one aspect of the invention relates to an ink that forms a protective layer on a substrate, wherein the ink includes an oligomer, a monomer and a photoinitiator. Another aspect of the invention relates to a method of making such an ink. A further aspect of the invention relates to a method of and apparatus for applying such an ink to a substrate.

BACKGROUND ART

During printing, ink is deposited on a substrate surface; the substrate being, for example, paper or plastic. It is then common to cover the printed surface of the substrate with a protective layer. The protective layer completes the fixing of the image printed on the substrate and substantially protects the printing against certain external threats such as, for example, projections, as well as light, heat and/or moisture. It is known to use an ink-jet. This protective layer on the printed substrate is generally deposited by an ink-jet printing. The varnish also makes it possible to customize the document by revealing areas with designs in varnish and other areas without varnish.

U.S. Pat. No. 7,279,506, filed May 5, 2004, Ser. No. 10/838,212, discloses an example of an overprint ink deposited by an ink-jet printer, where the overprint ink composition includes oligomers and monomers hardenable by radiation and at least one photoinitiator to initiate polymerization and thus the rigidification of the deposited overprint layer. This document proposes a diversified selection of a number of components to produce such an overprint ink. However, the choice of these components and their mixture is dictated in the proportions of oligomers and monomers which yield an overprint ink whose viscosity lies between 15 mPa·s at 40° C. and 8 mPa·s at 70° C. An overprint ink with such a viscosity requires heating the print heads to temperature ranges high enough to avoid agglomeration of the varnish. Unfortunately, this causes the print heads, which are relatively expensive parts of the printing devices, to deteriorate more rapidly than if they were operated at a lower temperature.

The present invention aims to overcome one or more disadvantages of the prior art by providing a protective overprint ink for use with ink-jets, wherein the ink reduces the rate of deterioration of ink-jet print heads and that functions in temperature ranges that do not require significant heating of the overprint ink (frequently referred to herein as a varnish) during its deposition on a printed substrate.

SUMMARY OF THE INVENTION

According to one aspect of the invention, an overprint ink-jet ink composition comprises one hardenable oligomer, one hardenable monomer selected from a group including alkoxylated and/or poly-alkoxylated acrylic monomers comprising one or more di- or tri-acrylates, and a photoinitiator. The hardenable oligomer is selected from a group have a viscosity greater than 1 Pa·s at room temperature, e.g., 23° C., the oligomer to monomer weight ratio is between 1/6 and 1/25, and the ink component mixture has a viscosity between 15 and 22 mPa·s at room temperature, e.g., 25° C. and between 5 and 2 mPa·s at 60° C., and a surface tension between 15 and 28 mN/m at room temperature, e.g., 23° C. (Unless otherwise indicated, all percentages and ratios are by weight.)

According to an alternate embodiment, the hardenable oligomer is selected from a group having a viscosity greater than 1 Pa·s at room temperature, e.g., 23° C., and the oligomer to monomer ratio is between 1/7 and 1/21.

According to an alternate embodiment, the overprint ink-jet ink composition comprises a viscosity reducer that facilitates adhesion of varnish to the printed substrate, and/or an inhibiter of free radicals.

According to another alternate embodiment, the overprint ink-jet ink has an electrical conductivity less than 1.5 µS/cm.

According to a first characteristic of the embodiment, the photoinitiator comprises 2-methyl-1-4-methylthiophenyl-2-4-morpholinyl-propanone.

According to a second characteristic of the embodiment, the photoinitiator comprises 2-isopropyl-thioxanthone.

According to an alternate embodiment, the overprint ink-jet ink comprises N-vinylcaprolactam to ensure adhesion of the varnish on the surface of the printed substrate.

According to one characteristic of the embodiment, the hardenable oligomer having a viscosity greater than 1 Pa·s at room temperature comprises at least one aliphatic urethane di-acrylate.

According to another characteristic of the embodiment, the hardenable oligomer having a viscosity greater than 1 Pa·s at room temperature comprises at least one hexa-functional urethane acrylate.

According to another characteristic of the embodiment, the hardenable oligomer whose viscosity is greater than 1 Pa·s at room temperature comprises at least one bisphenol A epoxy di-acrylate.

According to an alternate embodiment, the overprint ink-jet ink composition comprises at least one additive with a granulometry less than 50 µm, this additive being: (1) a flatting agent for obtaining a matt or satin varnish; and/or (2) flakes for obtaining a flaked varnish; and/or (3) pigments and/or colorants for obtaining a colored varnish; and/or (4) pigments and/or fluorescent colorants for obtaining a fluorescent varnish; and/or (5) pigments and/or colorants that are sensitive to black light for obtaining a varnish with an optical effect.

According to an alternate embodiment, the overprint ink-jet ink composition has a granulometry suited for the ink to pass through an ink-jet nozzle.

The invention also relates to a method of and apparatus for forming a protective layer on a substrate wherein any of the previously described ink-jet inks form the protective layer and the photoinitiator of the ink is activated by a UV source having a suitable wavelength and intensity.

Another aspect of the invention relates to a method of making the previously described ink-jet inks.

This aspect is achieved by: (1) mixing the viscosity reducer with the inhibiter of free radicals, and a photoinitiator at a temperature between 150 and 300° C.; (2) cooling the resulting mixture to room temperature; and (3) adding, under agitation at least one hardenable oligomer according to the varnish composition, and at least one hardenable monomer according to the varnish composition. Preferably, step (3) is performed after step (2).

The method also preferably includes filtering the mixture including the oligomer and the monomer so it has a granulometry suitable for passage through an ink-jet nozzle during ink-jet deposition on the printed substrate.

The invention, with its characteristics and advantages, will become clearer upon reading the description made in reference to the annexed drawings

BRIEF DESCRIPTION OF THE DRAWING

FIG. 1 is a table including the compositions of three preferred varnishes; and

DETAILED DESCRIPTION OF THE DRAWING

Figure 2:
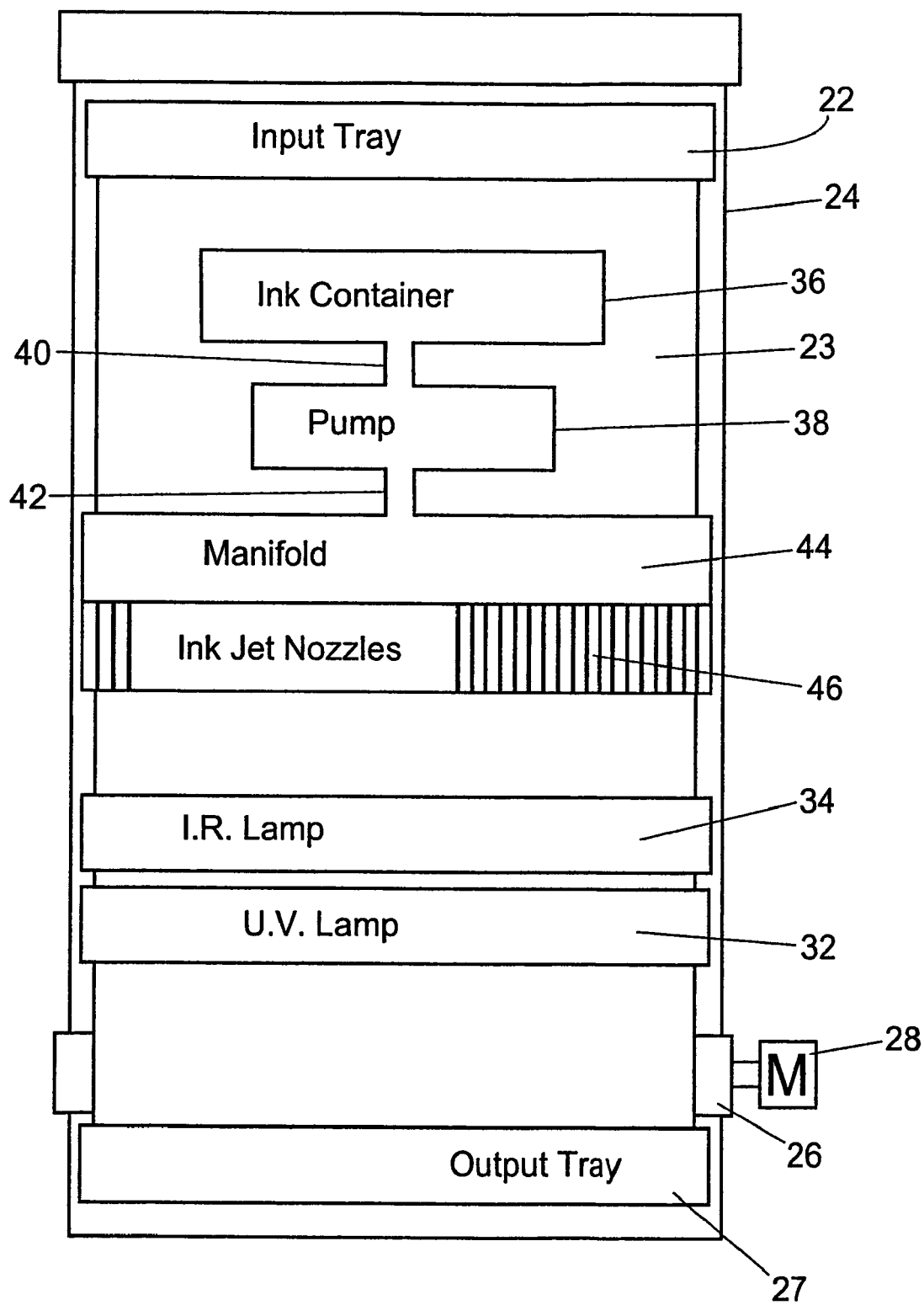
FIG. 2 is a diagram of an ink-jet printer including ink-jet nozzles responsive to ink-jet inks having one of the compositions set forth in the table of FIG. 1.

The molecules cited in the present document are not restrictive with regard to the composition of the overcover ink-jet ink of the present invention, but are illustrative of molecules, monomers or polymers that have or exhibit identical or similar characteristics, properties or functions.

The present invention relates to a protective overcover ink-jet ink, which can be transparent, intended to cover the surface of printing on a substrate. This ink is prepared without solvent and contains at least one hardenable oligomer having a viscosity is greater than 1 Pa·s at room temperature, e.g., 23° C., and a hardenable monomer selected from a group including alkoxylated and/or poly-alkoxylated acrylic monomers comprising one or more di- or tri-acrylates, and a surface photoinitiator.

It is important that the choice of the oligomer or mixture of oligomers is made from a group whose components have a viscosity higher than 1 Pa·s at room temperature, e.g., 23° C. According to a preferred embodiment, this viscosity is greater than 1 Pa·s at room temperature, e.g., 23° C. The mixture of oligomers increases the reactivity of the ink composition and its chemical and physical resistance, such as, for example, to scratches. This oligomer is combined in the ink composition with various monomers that contribute other properties to the ink. Depending on the type of oligomer used and the level of viscosity sought for the ink, the weight ratio between oligomers and monomers in the composition is between 1/6 and 1/25. According to a preferred embodiment of the ink composition, this ratio is preferentially between 1/7 and 1/21.

The choice of oliger depends on the type of ink sought, particularly according to the material of the substrate and the desired physical characteristics of the substrate after it has been covered by the ink. However, the viscosity of the oligomer lies between 5 and 45 Pa·s, at room temperature and is preferentially between 12 and 29 Pa·s at 25° C. In the case of polymerization, where rapid drying is necessary to obtain a covering having a suitable hardness or rigidity over the printed subject matter on an appreciably rigid plastic substrate, the selected oligomer is a hexa-functional aliphatic urethane acrylate, available, for example, under the names EBECRYL 1290 or EBECRYL 5129. This oligomer is also commonly available under the name EBECRYL 220 and has a viscosity of about 28.5 Pa·s at 25° C.; see the fourth column of FIG. 1. EBECRYL 220 is a hexa-functional aromatic urethane acrylate, whereas EBECRYL 1290 and EBECRYL 5129 are hexa-functional aliphatic urethane acrylates. Hexafunctional urethane acrylate can, depending on the case, be replaced by bisphenol A epoxy di-acrylate, available as EBECRYL 605 which has a viscosity of about 7.5 Pa·s at 25° C.; see the fifth column of FIG. 1. On the other hand, when the varnish is intended to be deposited on a more flexible substrate, such as paper, the oligomer that is preferred as the principal oligomer of the mixture is an aliphatic urethane di-acrylate. This oligomer is readily available under the name EBECRYL 8402 and has a viscosity of about 12.5 Pa·s at 25° C. With the use of this oligomer, the deposited ink has a higher flexibility than that of ink including bisphenol A epoxy di-acrylate, which has less rigidity than that of an ink including hexa-functional urethane acrylate; see the third column of FIG. 1.

Ink flexibility and rigidity are also a function of the relationship between the oligomers and monomers in the composition. Thus, a bisphenol A epoxy di-acrylate is used with an oligomer/monomer ratio that has a value between 1/6 and 1/9. Preferentially, this ratio lies between 1/7 and 1/8, and optimally is about 1/7.5. When the oligomer is a hexa-functional urethane acrylate, the mixture is prepared with a much lower oligomer/monomer ratio between 1/15 and 1/25. Preferentially, this ratio is between 1/19 and 1/22, and optimally is about 1/20.5. The use of hexa-functional urethane acrylate thus requires a more restricted quantity of the hardening component in the ink compared with bisphenol A epoxy di-acrylate. If aliphatic urethane di-acrylate is used, the oligomer/monomer ratio has a value between 1/8 and 1/12. This ratio is preferentially located between 1/9 and 1/11, and optimally has a value of 1/10.

It is possible to envisage mixtures of oligomers, and notably mixtures bringing together various oligomers cited above, of a type that the composition of the mixture yields an ink with properties common or intermediate between flexible inks and hard inks. These "intermediate" inks thus combine flexibility and resistance to possible damage.

The monomers that complete the ink composition, in addition to those having hardening capacities, are selected with respect to their properties. Thus, certain monomers that increase varnish reactivity are used, such as, for example, tripopylene-glycol-di-acrylate or propoxylated-glycerol-tri-acrylate, respectively known as TPGDA and OTA 480. The latter component also provides chemical resistance to the mixture. Other monomers are used to reduce ink viscosity. These monomers are, for example, octyl-decyl-acrylate and isobornyl-acrylate, respectively known as EBECRYL ODA and IBOA. Octyl-decyl-acrylate also restricts surface tension in the mixture. Similarly, the use of isobornyl-acrylate facilitates adherence of the ink to the substrate surface during its deposition on the substrate surface. Adherence to appreciably rigid surfaces, such as plastics or PVC (polyvinyl chlorides), can be improved by using N-vinylcaprolactam as one of the monomers in the ink composition.

To obtain an optimal spreading of ink on the surface of the printed substrate, the ink composition includes a surfactant that can, for example, be a mixture with the name Tego Wet 500. Other surfactants can be used, such as, for example, and in a nonrestrictive way, polyether siloxane, alkoxylated alcohol, a fluoro-surfactant, or a silicone-free surfactant.

The polymerization reaction when the ink is projected on the surface of the substrate is initiated by at least one photoinitiator which can be of the deep or surface type. These photoinitiators are, for example, Additol ITX and/or Irgacure 907, which correspond respectively to 2-iso-propyl-thioxanthone and 2-methyl-1-4-methylthiophenyl-2-4-morpholinyl-propanone. These photoinitiators initiate the ink polymerization reaction only in the presence of UV radiation. The absorption peaks used to ensure the formation of the free radicals that initiate ink polymerization generally have a wavelength of about 300 to 390 nm for Additol ITX and a wavelength of about 230 to 304 nm for Irgacure 907. This radiation is obtained by a UV emitter within the ink-jet printer that deposits the ink on the substrate. Other photoinitiators could be used, such as, for example, and in a nonrestrictive way, benzophenone, 2,4,6-tri-methyl-benzoyl-di-phenyl phosphine oxide, 1-hydroxy-cyclo-hexyl-phenyl-ketone, iso-propyl-thioxanthone, N-methyl-diethanolamine, or di-phenyl(2,4,6-tri-methyl-benzoyl)-phosphine oxide.

To avoid an agglomeration of ink under the action of heat under undesired conditions, the ink includes an antioxidant that acts to inhibit free radicals. This inhibition can be ensured, for example, by including in the ink composition a polymerization inhibitor in an acrylic acid ester, such as mixture listed under the name Genorad 16 or Additol S110.

The various components that are combined to form the inks indicated by the third, fourth and fifth columns of FIG. 1, are mixed in given proportions, as follows: (1) the free radical inhibiter, Genorad 16, which is present in a proportion of 0.1 to 2.0% of the total weight of the ink mixture, preferentially in a proportion of 1.0% of the final mixture; (2) the surfactant, Tego Wett 500, which is present in a proportion of 0.1 to 2.0% of the total weight of the ink mixture, preferentially in a proportion of 1.0% of the final mixture; (3) the surface and deep photoinitiators, which are present so the total proportion of the surface and deep photoinitiators is in the range of 8 to 15% of the total weight of the ink (preferably 12%), wherein the proportion of the surface photoinitiator Additol ITX is in the range of 4.0 to 10.0% of the total weight of the ink (preferably 7.2%), and the proportion of the deep and surface photoinitiator Irgacure 907 is in the range of 2.0 to 4.9% of the total weight of the ink (preferably 4.9%)); (4) the functional monomer that ensures adhesion of the ink to the printed substrate, i.e., N-vinylcaprolactam, which is present in a proportion of 8 to 15%, preferentially in a proportion of 10% of the final mixture; (5) the functional monomer that improves the reactivity of the mixture, i.e., tripopylene-glycol-di-acrylate, which is present in a proportion of 15 to 25% of the total weight of the ink mixture, preferentially in a proportion of 20% of the final mixture; and (6) the functional monomer that reduces surface tension and viscosity, EBECRYL ODA, which is present in a proportion of 12 to 18% of the total weight of the ink mixture, preferentially in a proportion of 15% of the final mixture.

The set of components that comprises the oligomer or mixture of oligomers, the functional monomer that initiates the reaction, which is OTA 480, and the functional monomer that increases adhesion, which is IBOA, form a mixture which accounts for 25 to 35% of the final composition, preferentially 30%. The proportions can be modified according to the type of oligomer or the types of oligomers in the ink composition.

When the selected oligomer is a bisphenol A di-acrylate, it accounts for approximately 8 to 15% of the weight of the final ink mixture, preferentially 10%; in this case OTA 480 and IBOA are present in proportions of about 12-18% of the weight of the final ink mixture, preferentially 15%. On the other hand, when the selected oligomer is a hexa-functional urethane acrylate or an aliphatic urethane di-acrylate, IBOA accounts for approximately 15 to 25% of the weight of the final ink mixture, preferentially 20%. However, if the oligomer is an aliphatic urethane di-acrylate, the oligomer accounts for 5 to 15% of the weight of the final ink mixture, preferentially 8% and OTA 480 accounts for 10 to 15% of the weight of the final ink mixture, preferentially 12%. Similarly, if the oligomer is a hexa-functional urethane acrylate, the proportions are changed so that the oligomer accounts for 2 to 5% of the weight of the final ink mixture, preferentially 4%, and OTA 480 accounts for 15 to 18% of the weight of the final ink mixture, preferentially 16%.

According to the type of ink desired to be produced, additional elements can be added to the components. Thus, to produce mat or satin varnish, flatting agents are included in the mixture. To obtain a flaked varnish, flakes are added. To create colored varnishes, pigments or colorants of the desired colors are added, and these pigments can be fluorescent or sensitive to black light to obtain a specific varnish.

The ink can include in its composition at least one resin chosen from among the acrylic, vinyl, ketone, polyester, and aldehyde resins. This resin is added to the composition in a proportion of about 5 to 10% of the weight of the final ink mixture. The choice of the resin is a function of the substrate and the required result. These resins have properties that improve the chemical resistance of the final composition and the mechanical resistance of the deposited ink. An example of a vinyl resin likely to possess properties of adhesion to the substrate is the resin known as VYHH.

The varnishes of columns 3-5 of FIG. 1 are produced by: (1) mixing the viscosity reducer with the inhibiter of free radicals and a photoinitiator at a temperature between 150 and 300° C. according to the desired speed of the mixture; (2) cooling the mixture to room temperature; and (3) adding to the cooled mixture, while the mixture is being agitated, at least one hardenable oligomer according to the ink composition, and/or at least one hardenable monomer according to the ink composition, as well as all other elements entering the ink composition.

According to a preferred method, the surfactant is added last to avoid the formation of foam during agitation of the components being mixed. To limit the appearance of foam, anti-foam agents, such as polyether syloxane, is added to the mixture. This anti-foam agent is added in a proportion of 0.1 to 1.0% of the weight of the ink, preferably 0.3%. Tego Foamex 805 is an exemplary surfactant. The surface tension of the mixture obtained is between 15 at 28 mN/m at 23° C., preferentially between 20 to 28 mN/m at 23° C.

The mixture obtained has an electrical conductivity below 1.5 µS/cm, preferably less than 0.8 µS/cm, and ideally 0.1 µS/cm.

The production method can also include a step of filtering the mixture obtained according to a granulometry adapted for the passage of the ink in an ink-jet nozzle during deposition on the printed substrate. The ink can be deposited either by the known technique, called "bubble jet", which involves projecting the ink contained in a nozzle by overpressure created by a gas bubble formed by resistance to heat. The other known technique which involves forming an overpressure by using a piezoelectric component which curves under the effect of an electric voltage to reduce the volume of the tank of ink can also be used. Because the varnish is projected via a nozzle, it is important that the granulometry of the varnish components not obstruct the nozzle. Thus, filtration is less than 10 µm, preferentially at 5 µm and optimally at 1 µm.

According to a preferred but not restrictive method of the invention, the determination of the physical parameters of the components or composition takes place at the temperatures indicated and under usual pressure conditions on the earth's surface, preferentially about one atmosphere (1013 mBar). Thus viscosity can be measured using a HAAKE Viscotester 550 viscometer equipped with an NV Cup and an NV Rotor which are known measuring instruments, marketed by ThermoFisher. The viscometer uses a system of temperature control, connected to a temperature controlled bath, for maintaining the varnish sample at a temperature of 25° C. Similarly, surface tension is measured, preferably by using a DSA 100 tensiometer with a hanging drop method, marketed by KRÜSS. Granulometry and electrical conductivity is measured using a particle size measuring device MASTERSIZER 2000, marketed by MALVERN, and a CYBERSCAN CON 11 conductivity meter from EUTECH INSTRUMENTS with a measuring cell reference ECCONSEN91W/35608-50 having a cell constant of K=1.0.

FIG. 2, a top schematic diagram of an ink-jet printer with which the inks of columns 3-5 of FIG. 1 can be used, includes input tray 22 containing a stack of previously printed substrates 23 that are to have a protective coating applied to them. The substrates in tray 22 are supplied, one at a time, to conveyer belt 24, driven by roller 26, in turn connected to be turned by motor 28 so that the substrates lie flat on the belt and printing on them faces upwardly, away from the surface of belt 24. Belt 24 translates substrates 23 past non-impact ink-jet printer 30, thence past IR heating and ink drying lamps 34 and then UV source 32 to output tray 27. Ink-jet printer 30 includes ink container 36 containing one of the inks set forth in the third-fifth columns of FIG. 1. The ink in container 36 is supplied by pumps 38 and pipes 40 and 42 to manifold 44 which distributes the ink to a linear array of ink-jet nozzles 46 that extend between opposite edges of substrate 23. Ink-jet nozzles 46 include piezoelectric actuators for controlling aspects (e.g., volume and/or diameter and/or shape) of droplets of the ink in container 36 and supplied by nozzles 46 to substrate 23. IR heating and ink drying lamps 34. Source 36 emits UV radiation having sufficiently intensity and wavelengths as specified above. The UV radiation is incident on the ink deposited by nozzles 46 on substrate 23 to activate the photoinitiator in the ink.

It should be obvious for those persons of ordinary skill in the art that the present invention allows embodiments of a variety of specific forms without departing from the spirit and scope of the invention as claimed. Consequently, the present embodiments must be considered as illustrations but can be modified in the field defined by the scope of the attached claims. For example, the ink-jet nozzle arrangement can be one or more ink-jet nozzles that scan from edge to edge or the illustrated stationary array of ink-jet nozzles.

The invention claimed is:

1. An ink-jet ink comprising hardenable oligomer, hardenable monomer selected from a group including alkoxylated and/or poly-alkoxylated acrylic monomers having one or more di- or tri-acrylates, and a photoinitiator, the hardenable oligomer having a viscosity greater than 1 Pa·s at room temperature and includes hexa-functional urethane acrylate, the oligomer to monomer weight ratio being between 1/6 and 1/25, and the ink component mixture having a viscosity between 15 and 22 mPa·s at room temperature and between 5 and 2 mPa·s at 60° C., and a surface tension between 15 and 28 mN/m at room temperature.

2. The ink according to claim 1, wherein the hardenable oligomer is selected from a group having a viscosity greater than 1 Pa·s at room temperature, and wherein the oligomer to monomer weight ratio is between 1/7 and 1/21.

3. The ink of claim 1, further including a viscosity reducer for facilitating adhesion of the ink to a printed substrate, and/or, an inhibiter of free radicals.

4. The ink of claim 1, wherein the ink has an electrical conductivity less than 1.5 µSm/cm.

5. The ink of claim 1, wherein the photoinitiator includes 2-methyl-1-4-methylthiophenyl-2-4-morpholinyl-propanone.

6. The ink of claim 5, wherein the photoinitiator includes 2-isopropyl-thioxanthone.

7. The ink of claim 1, wherein the photoinitiator includes 2-isopropyl-thioxanthone.

8. The ink of claim 1, further including N-vinylcaprolactam to provide adhesion of the ink on the surface of a printed substrate.

9. The ink of claim 1, wherein the hardenable oligomer having a viscosity greater than 1 Pa·s at room temperature includes aliphatic urethane di-acrylate.

10. The ink of claim 1, wherein the hardenable oligomer having a viscosity greater than 1 Pa·s at room temperature includes bisphenol A epoxy di-acrylate.

11. The ink of claim 1 further including an additive with a granulometry less than 50 µm, this additive including at least one of the following:
    a flatting agent for obtaining a mat or satin ink, and/or,
    flakes for obtaining a flaked ink,
    pigments and/or colorants for obtaining a colored ink,
    pigments and/or fluorescent colors for obtaining a fluorescent ink,
    pigments sensitive to black light for obtaining a ink for optical purposes, and
    colorants sensitive to black light for obtaining a ink for optical purposes.

12. The ink of claim 1, wherein the ink has a granulometry suited for passing through a nozzle when ink is deposited by an ink-jet on a printed substrate.

13. A method of producing the ink of claim 3, the method comprising:
    mixing the viscosity reducer with the inhibiter of free radicals, and the photoinitiator at a temperature between 150 and 300° C.,
    cooling the resulting mixture to room temperature,
    adding under agitation at least one hardenable oligomer according to the ink composition, and at least one hardenable monomer according to the ink composition.

14. The method of claim 13, further including filtering the mixture resulting from the cooling and adding under agitation according to a granulometry so the mixture resulting from the cooling and adding under agitation can pass through a nozzle during deposition by the ink-jet nozzle on the printed substrate.

15. The ink of claim 1 wherein the room temperature is in the range of 23-25° C.

16. A method of depositing a protective layer on a substrate comprising projecting the ink-jet ink of claim 1 through a non-impact ink-jet nozzle arrangement onto the substrate and then irradiating the ink on the substrate with ultraviolet energy to which the photoinitiator is responsive.

17. The method of claim 16 wherein the nozzle is vibrated by a piezoelectric actuator.

18. The ink of claim 1 wherein the room temperature is 25° C.

* * * * *